(12) United States Patent
Kitagawa et al.

(10) Patent No.: US 9,054,713 B2
(45) Date of Patent: Jun. 9, 2015

(54) SEMICONDUCTOR DEVICE GENERATING INTERNAL CLOCK SIGNAL HAVING HIGHER FREQUENCY THAN THAT OF INPUT CLOCK SIGNAL

(71) Applicant: ELPIDA MEMORY, INC., Chuo-ku, Tokyo (JP)

(72) Inventors: Katsuhiro Kitagawa, Tokyo (JP); Hiroki Takahashi, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 0 days.

(21) Appl. No.: 13/959,119

(22) Filed: Aug. 5, 2013

(65) Prior Publication Data
US 2014/0035639 A1   Feb. 6, 2014

(30) Foreign Application Priority Data
Aug. 6, 2012   (JP) .................. 2012-174294

(51) Int. Cl.
| | |
|---|---|
| *H03L 7/00* | (2006.01) |
| *H03L 7/08* | (2006.01) |
| *H03L 7/081* | (2006.01) |
| *H03L 7/22* | (2006.01) |
| *G11C 7/22* | (2006.01) |
| *G11C 11/4076* | (2006.01) |
| *G11C 29/12* | (2006.01) |
| *G11C 29/14* | (2006.01) |

(52) U.S. Cl.
CPC .......... *H03L 7/0802* (2013.01); *H03L 7/0816* (2013.01); *H03L 7/22* (2013.01); *G11C 7/222* (2013.01); *G11C 11/4076* (2013.01); *G11C 29/12015* (2013.01); *G11C 29/14* (2013.01)

(58) Field of Classification Search
CPC . H03K 19/00; H03K 19/1778; H03K 3/0231; H03K 5/133; H03K 17/56; H03K 19/1776; H03K 3/0322
USPC .......... 327/156, 158, 161, 261; 375/371, 373, 375/375
See application file for complete search history.

(56) References Cited

U.S. PATENT DOCUMENTS

| | | | | |
|---|---|---|---|---|
| 5,451,894 | A  * | 9/1995 | Guo ............................. | 327/241 |
| 6,928,128 | B1 * | 8/2005 | Sidiropoulos ................ | 375/376 |
| 2002/0015461 | A1 * | 2/2002 | Propp et al. .................. | 375/376 |
| 2006/0220721 | A1 * | 10/2006 | Vig et al. ...................... | 327/261 |

FOREIGN PATENT DOCUMENTS

JP    2010-192976 A    9/2010

* cited by examiner

*Primary Examiner* — John Poos

(57) ABSTRACT

Disclosed herein is a device that includes: a plurality of delay circuits each including an input node, an output node, a first power node and a second power node, and a control circuit. The delay circuits are coupled in series with the input node of a leading delay circuit receiving a first clock signal and the output node of a last delay circuit producing a second clock signal. The control circuit coupled to receive the first and second clock signals to control an operating voltage supplied between the first and second power lines. The first power nodes of the delay circuits are connected in common to the first power line, and the second power nodes the delay circuits are connected in common to the second power line.

20 Claims, 16 Drawing Sheets

320

US 9,054,713 B2

SEMICONDUCTOR DEVICE GENERATING INTERNAL CLOCK SIGNAL HAVING HIGHER FREQUENCY THAN THAT OF INPUT CLOCK SIGNAL

BACKGROUND OF THE INVENTION

1. Field of the Invention

The present invention relates to a semiconductor device, and more particularly relates to a semiconductor device including a multiplier oscillator that multiplies a clock signal.

2. Description of Related Art

A ring oscillator is generally known as a circuit that generates an internal clock signal with a high frequency (see Japanese Patent Application Laid-open No. 2010-192976). The ring oscillator includes odd numbers of inverter circuits cyclically-connected to generate a clock signal with a predetermined frequency depending on not only the number of stages of the inverter circuits, but also characteristics of transistors included in the inverter circuits, an operating voltage, and the like. The clock signal generated by the ring oscillator is supplied to, for example, a PLL (Phase-Locked Loop) circuit, so that an internal clock signal having higher frequency than that of an external clock signal supplied from outside can be obtained.

However, in the PLL circuit using the ring oscillator, a generable frequency of the internal clock signal is limited by the oscillation frequency of the ring oscillator and thus the oscillation frequency of the ring oscillator needs to be increased to generate the internal clock signal with a higher frequency. Accordingly, in some cases, a boosted potential needs to be used as the operating voltage of the ring oscillator, which increases the circuit scale.

In recent years, the operating voltage of a semiconductor device tends to be lowered from a viewpoint of reducing power consumption or decreasing jitter. Meanwhile, a threshold voltage of a transistor is sometimes designed to be sufficiently high to reduce an off-leakage current of the transistor. A decrease in the operating voltage or an increase in the transistor threshold voltage increases a delay amount of each stage of the inverter circuits included in the ring oscillator, which increases difficulty in increasing the oscillating frequency of the ring oscillator.

In the PLL circuit using the ring oscillator, when there is a slightest difference between the frequency of the external clock signal and the oscillating frequency of the ring oscillator, the difference is accumulated little by little and consequently a large phase difference may be caused. To reduce such a phase difference, a correction operation for the oscillating frequency needs to be constantly performed, which increases the power consumption.

With this background, a semiconductor device including a multiplier oscillator that can generate an internal clock signal with a high frequency without using a ring oscillator has been demanded.

SUMMARY

In one embodiment, there is provided a semiconductor device that comprises: a plurality of delay circuits connected in series, the delay circuits including an input-stage delay circuit receiving an input clock signal and an output-stage delay circuit outputting an output clock signal, each of the delay circuits representing a delay amount responsive to an operating voltage supplied thereto; a regulator circuit controlling the operating voltage to be supplied to each of the delay circuits in response to a phase relationship between the input clock signal and the output clock signal; and a synthesizing circuit configured to synthesize clock signals supplied to selected ones of the delay circuits to generate an internal clock signal.

In another embodiment, there is provided a method that comprises: electrically connecting N delay circuits in series, N being two or more integers; controlling a level of an operating voltage to be supplied to each of the delay circuits so that a delay amount of each of the delay circuits becomes 1/N of a cycle of an input clock signal supplied to a leading one of the delay circuits; and responding to signals to be respectively delayed by the delay circuits to generate an internal clock signal having a frequency that is N/2 times as large as the input clock signal.

In still another embodiment, such a device is derived that comprises: a plurality of delay circuits each including an input node, an output node, a first power node and a second power node, the delay circuits being coupled in series such that the output node of a preceding one of the delay circuits is coupled to the input node of the succeeding one of the delay circuits, the input node of a leading one of the delay circuits receiving a first clock signal, the output node of a last one of the delay circuits producing a second clock signal, the first power node of each of the delay circuits being connected to a first power line, and the second power node of each of the delay circuits being connected to a second power line; and a control circuit coupled to receive the first and second clock signals to control an operating voltage supplied between the first and second power lines.

DETAILED DESCRIPTION OF THE EMBODIMENTS

Figure 1:
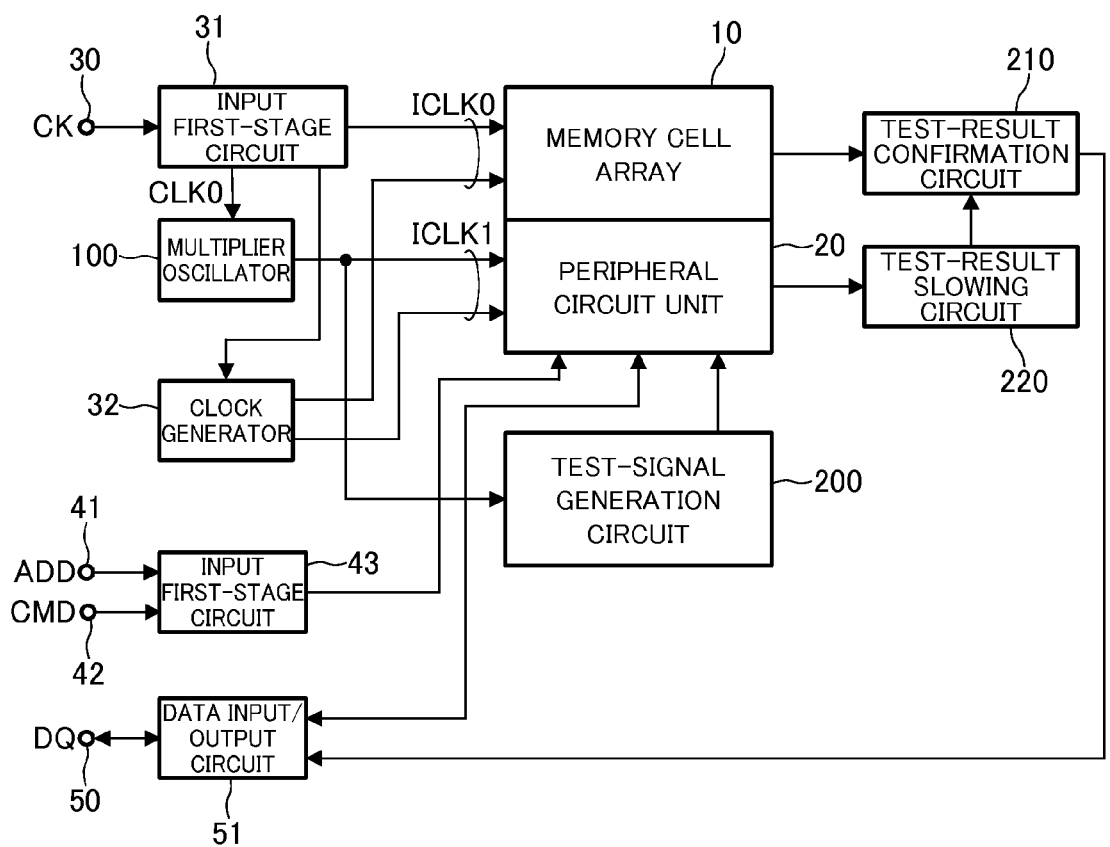
FIG. 1 is a block diagram showing a configuration of a semiconductor device according to an embodiment of the present invention.

Referring now to FIG. 1, the semiconductor device according to the embodiment of the present invention is a DRAM (Dynamic Random Access Memory) that performs a prefetch operation and includes a memory cell array 10 having a plurality of memory cells and a peripheral circuit unit 20 that controls an operation of the memory cell array 10. Although not particularly limited thereto, the number of bits to be prefetched is two in the case of a DDR (Double Date Rate) type, four in the case of a DDR2 type, and eight in the case of a DDR3 type. Because the DDR to DDR3 DRAMs perform input/output of data synchronously with both of a rise edge and a fall edge of a clock signal, a part of the peripheral circuit unit 20 needs to operate at a frequency twice as high as that of the memory cell array 10 in the case of the DDR2 type and at a frequency four times higher than that of the memory cell array 10 in the case of the DDR3 type.

The memory cell array 10 and the peripheral circuit unit 20 operate synchronously with internal clock signals ICLK0 and ICLK1 supplied from a clock generator 32, respectively. The clock generator 32 generates the internal clock signals ICLK0 and ICLK1 based on an external clock signal CK supplied from outside via a clock terminal 30 and an input first-stage circuit 31. The frequency of the internal clock signal ICLK1 is set to be the same frequency as that of the internal clock signal ICLK0 in the case of the DDR type, twice as high as that of the internal clock signal ICLK0 in the case of the DDR2 type, and four times higher than that of the internal clock signal ICLK0 in the case of the DDR3 type.

An address signal ADD and a command signal CMD supplied via an address terminal 41 and a command terminal 42, respectively, are supplied to the peripheral circuit unit 20 via an input first-stage circuit 43. Accordingly, when the command signal CMD indicates a read operation, the peripheral circuit unit 20 performs a read operation for the memory cell array 10, so that read data is read from a memory cell indicated by the address signal ADD. Read data DQ read from the memory cell array 10 is output to outside via a data input/output circuit 51 and a data input/output terminal 50. When the command signal CMD indicates a write operation, the peripheral circuit unit 20 performs a write operation for the memory cell array 10, so that write data DQ supplied from outside via the data input/output terminal 50 and the data input/output circuit 51 is written in a memory cell indicated by the address signal ADD.

A low-speed test and a high-speed test are performed for the semiconductor device of this embodiment before shipment. The low-speed test is performed for detecting defective memory cells included in the memory cell array 10 and replacing the detected defective memory cells with auxiliary memory cells. Because the low-speed test is performed for many semiconductor devices in parallel in a wafer state, a tester that enables a high-speed operation is impractical and thus a low-speed tester is used. Therefore, an external clock signal CK with a low frequency is used at the time of the low-speed test. After the defective memory cells are replaced with the auxiliary memory cells in the low-speed test, the wafer is diced to singulate semiconductor chips, the semiconductor chips are packaged, and then the high-speed test is performed. The high-speed test is an operation test using a high-speed external clock signal CK as at the time of a practical operation and is mainly performed to check whether the peripheral circuit unit 20 correctly operates at a high speed.

The high-speed test needs to use an expensive tester that can operate at a high speed, which is a factor of an increase in the manufacturing cost of a semiconductor device. To solve this problem, in the semiconductor device according to the present embodiment, the high-speed test can be also performed at the time of the low-speed test by using a multiplier oscillator 100 and a test-signal generation circuit 200.

The multiplier oscillator 100 generates the internal clock signal ICLK1 with a higher frequency than that of the external clock signal CK by multiplying the external clock signal CK supplied via the input first-stage circuit 31 at the time of the low-speed test. The test-signal generation circuit 200 is a circuit that internally generates the address signal ADD, the command signal CMD, and the write data DQ and supplies the address signal ADD, the command signal CMD, and the write data DQ to the peripheral circuit unit 20 at the time of the low-speed test. By including the multiplier oscillator 100 and the test-signal generation circuit 200, the semiconductor device according to the present embodiment enables the peripheral circuit unit 20 to operate at a high speed synchronously with the high-speed internal clock signal ICLK1 also at the time of the low-speed test. Accordingly, a part of or the entirety of the high-speed test performed using an expensive tester can be omitted.

When the low-speed test is first performed, the multiplier oscillator 100 and the test-signal generation circuit 200 are deactivated, the external clock signal CK, the address signal ADD, the command signal CMD, and the write data DQ are supplied to the terminals 30, 41, 42, and 50, respectively, and a test on the memory cell array 10 is performed. The frequency of the external clock signal CK is sufficiently lower than that to be used at the time of the practical operation and the address signal ADD, the command signal CMD, and the write data DQ are also supplied synchronously with the external clock signal CK. The result of the test is compressed by a test-result confirmation circuit 210 and is supplied to the tester via the data input/output terminal 50.

Meanwhile, when the high-speed test is performed, the multiplier oscillator 100 and the test-signal generation circuit 200 are activated and a low-speed external clock signal CK is supplied to the clock terminal 30. The address signal ADD, the command signal CMD, and the write data DQ are not supplied. The multiplier oscillator 100 receives the low-speed external clock signal CK and generates the high-speed internal clock signal ICLK1 by multiplying the external clock signal CK. The test-signal generation circuit 200 internally generates the address signal ADD, the command signal CMD, and the write data DQ synchronously with the internal clock signal ICLK1 and supplies the address signal ADD, the command signal CMD, and the write data DQ to the peripheral circuit unit 20. Accordingly, the peripheral circuit unit 20 can operate at the same speed as at the time of the practical operation. The internal clock signal ICLK0 having the same frequency as that of the low-speed external clock signal CK is supplied to the memory cell array 10. The result of the test is slowed down by a test-result slowing circuit 220 and supplied to the tester via the test-result confirmation circuit 210 and the data input/output terminal 50. Slowing down by the test-result slowing circuit 220 can be achieved, for example, by conversion of read data serially output from the peripheral circuit unit 20 into parallel read data, and the parallel read data can be compressed by the test-result confirmation circuit 210.

At the time of a normal operation, the multiplier oscillator 100 and the test-signal generation circuit 200 are deactivated.

A conventional high-speed test can be also performed in the same operation condition as at the time of the normal operation.

A specific circuit configuration of the multiplier oscillator 100 and an operation thereof are explained below in detail.

Figure 2:
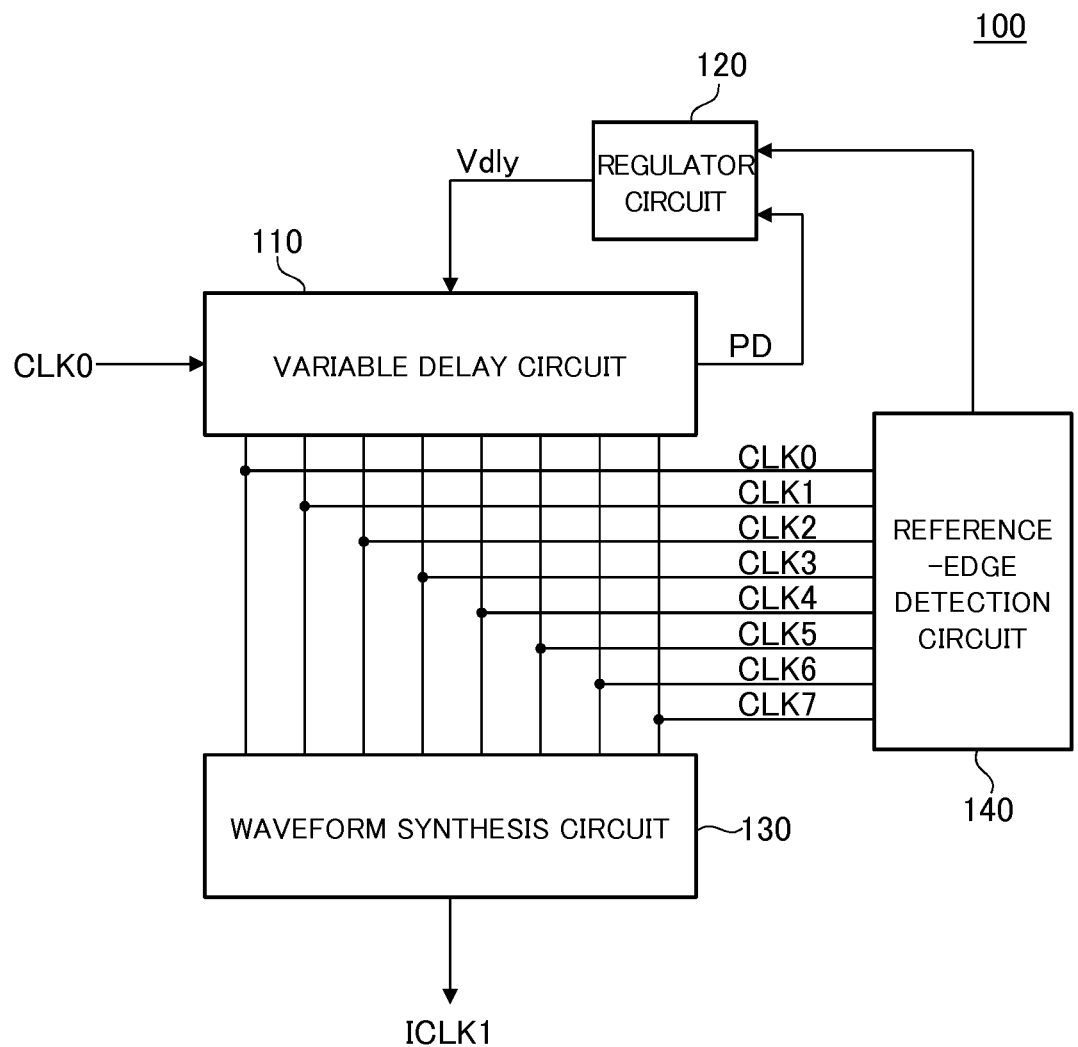
FIG. 2 is a block diagram showing a configuration of the multiplier oscillator shown in FIG. 1.

Turning to FIG. 2, the multiplier oscillator 100 includes a variable delay circuit 110 that receives an input clock signal CLK0 and generates a phase determination signal PD and clock signals CLK0 to CLK7 with different phases. The multiplier oscillator 100 further includes a regulator circuit 120 that generates an operating voltage Vdly of the variable delay circuit 110 based on the phase determination signal PD, and a waveform synthesis circuit 130 that generates the internal clock signal ICLK1 by synthesizing the clock signals CLK0 to CLK7.

Figure 3:
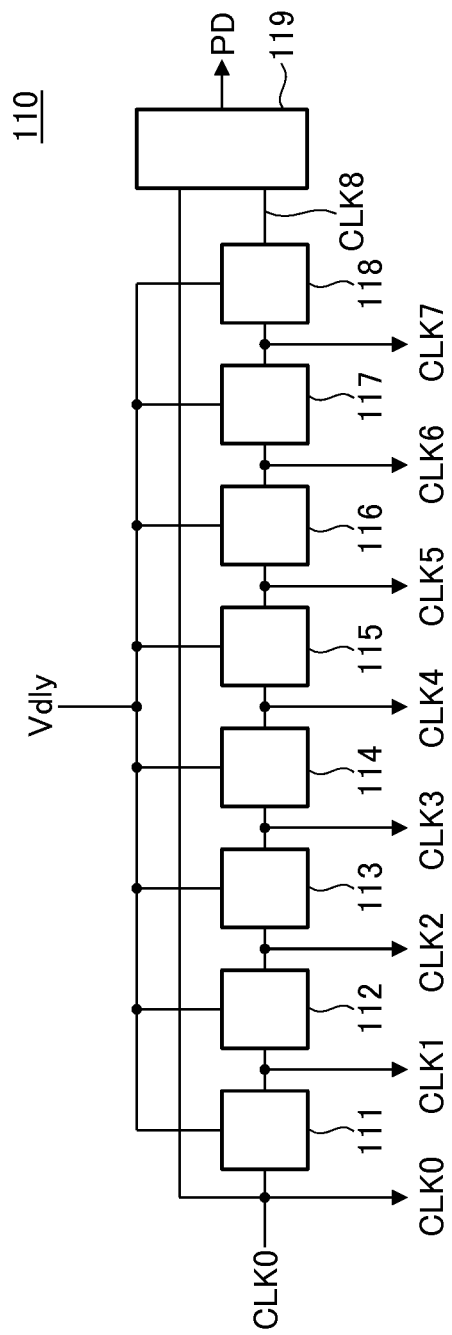
FIG. 3 is a circuit diagram of the variable delay circuit shown in FIG. 2.

Turning to FIG. 3, the variable delay circuit 110 includes eight delay circuits 111 to 118 that are cascade-connected and a phase discrimination circuit (or a phase comparator) 119 that compares phases of the clock signals CLK0 and CLK8 with each other. The delay circuits 111 to 118 receive the clock signals CLK0 to CLK7 and delay the received clock signals to output clock signals CLK1 to CLK8, respectively. The delay circuits 111 to 118 have the same circuit configuration as one another and all operate with the same operating voltage Vdly.

Figure 4:
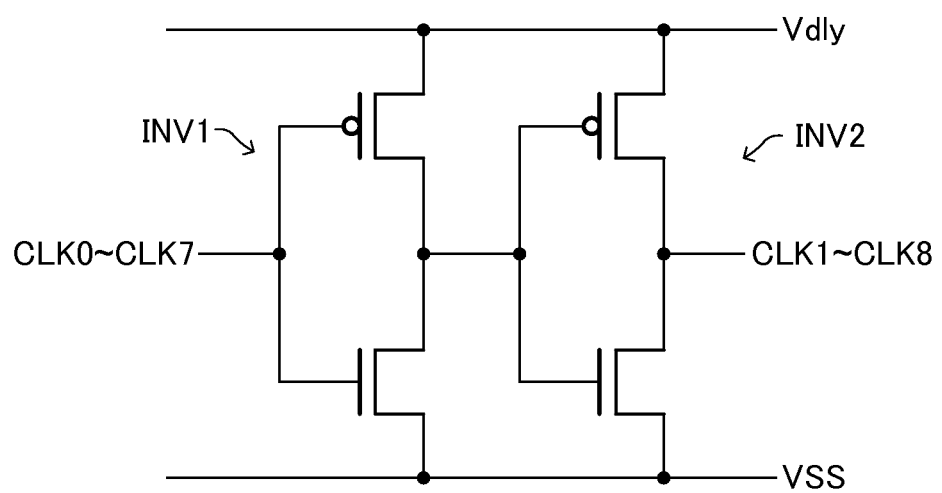
FIG. 4 is a circuit diagram of the delay circuits shown in FIG. 3.

Turning to FIG. 4, each of the delay circuits 111 to 118 includes two inverter circuits INV1 and INV2 that are cascade-connected. The operating voltage Vdly is supplied to a source of a P-channel MOS transistor included in each of the inverter circuits INV1 and INV2, and a ground potential VSS is supplied to a source of an N-channel MOS transistor included in each of the inverter circuits INV1 and INV2. With this configuration, a delay amount of one delay circuit can be controlled by the level of the operating voltage Vdly. Specifically, the delay amount of one delay circuit becomes smaller when the operating voltage Vdly has a higher level, and the delay amount of one delay circuit becomes larger when the operating voltage Vdly has a lower level. The circuit configuration of the delay circuits 111 to 118 is not limited to that shown in FIG. 4 and, for example, a circuit including four inverter circuits cascade-connected can be used.

Figure 5:
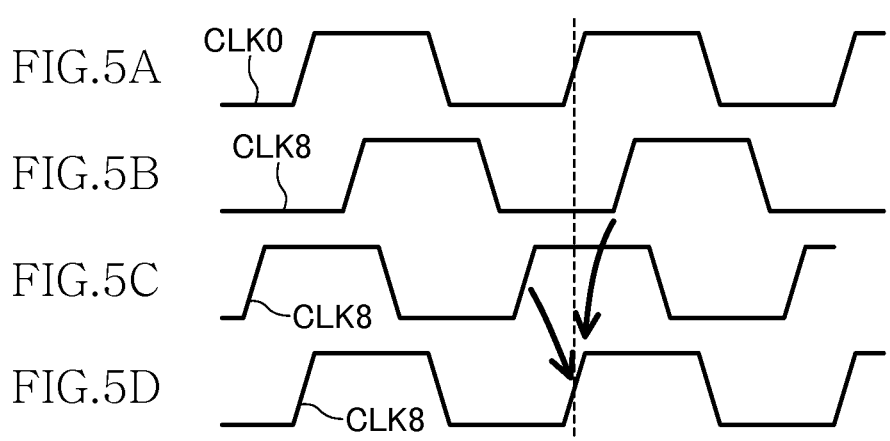
FIGS. 5A to 5D are explanatory diagrams of operations of the variable delay circuit shown in FIG. 2.

An operation of the variable delay circuit 110 and the regulator circuit 120 will be explained with reference to FIGS. 5A to 5D. FIG. 5A shows a waveform of the clock signal CLK0 and FIGS. 5B, 5C and 5D show waveforms of the clock signal CLK8.

First, when the clock signal CLK8 has a phase shown in FIG. 5B, that is, when the phase of the clock signal CKL8 is delayed with respect to that of the clock signal CLK0, the phase discrimination circuit 119 shown in FIG. 3 sets the phase determination signal PD to a high level. This determination is performed based on a fact that the clock signal CLK8 has a low level at a timing when the clock signal CLK0 changes from a low level to a high level. When the phase determination signal PD has a high level, the regulator circuit 120 increases the level of the operating voltage Vdly. As a result, the delay amount of one delay circuit is decreased and thus the phase of the clock signal CLK8 is advanced.

On the contrary, when the clock signal CLK8 has a phase shown in FIG. 5C, that is, the phase of the clock signal CLK8 is advanced with respect to that of the clock signal CLK0, the phase discrimination circuit 119 sets the phase determination signal PD to a low level. This determination is performed based on a fact that the clock signal CLK8 has a high level at a timing when the clock signal CLK0 changes from a low level to a high level. When the phase determination signal PD has a low level, the regulator circuit 120 decreases the level of the operating voltage Vdly. As a result, the delay amount of one delay circuit is increased and thus the phase of the clock signal CLK8 is delayed.

By repeating this operation, the phase of the clock signal CLK8 is controlled to match with the phase of the clock signal CLK0 as shown in FIG. 5D. A state where the phases of the clock signal CLK0 and the clock signal CLK8 match, that is, a state where the phases are locked means that a delay amount obtained by the delay circuits 111 to 118 is equal to an integral multiple of a cycle of the clock signal CLK0. When the delay amount obtained by the delay circuits 111 to 118 is equal to one cycle of the clock signal CLK0 in this case, the phases of the clock signals CLK0 to CLK7 output from the variable delay circuit 110 are shifted from one another by ⅛ clock cycle. While the clock signals CLK0 to CLK7 are extracted from the variable delay circuit 110 in the present embodiment, the clock signals CLK1 to CLK8 may be extracted instead of the clock signals CLK0 to CLK7.

Figure 6:
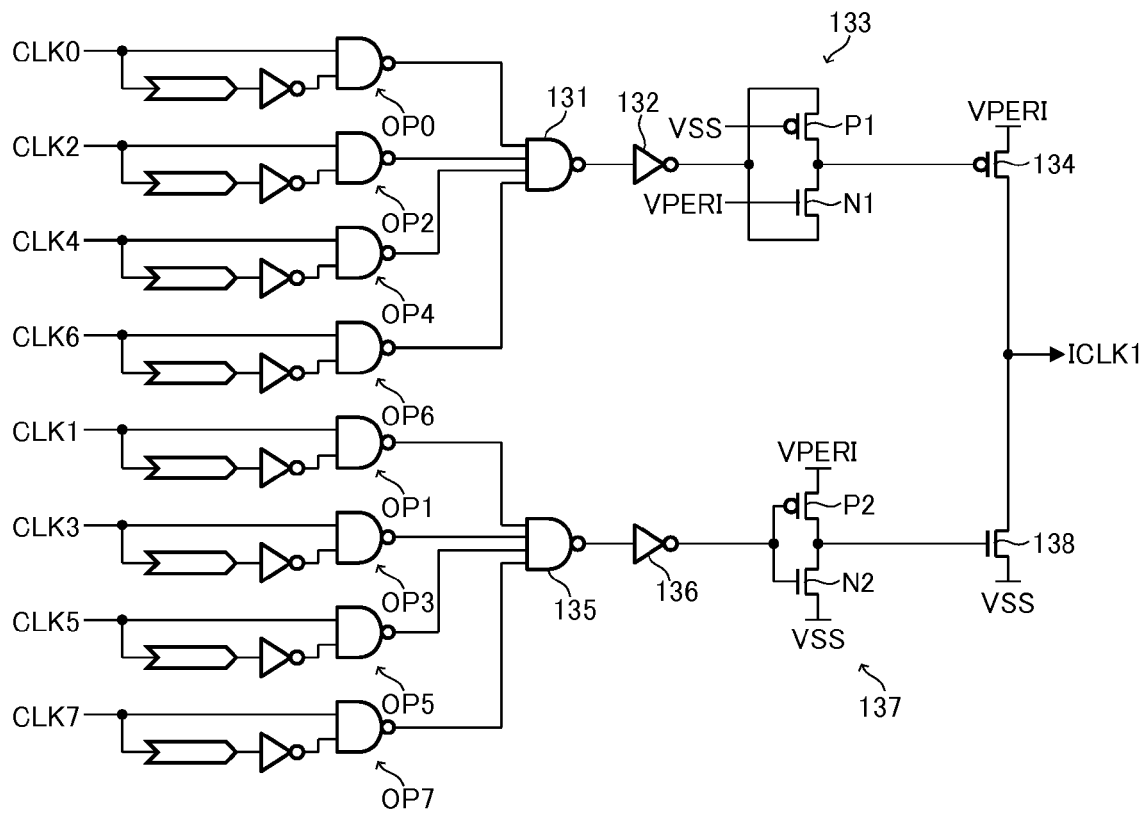
FIG. 6 is a circuit diagram of the waveform synthesis circuit shown in FIG. 2.

Turning to FIG. 6, the waveform synthesis circuit 130 includes one-shot-pulse generation circuits OP0 to OP7 to which the clock signals CLK0 to CLK7 are supplied, respectively. Each of the one-shot-pulse generation circuits OP0 to OP7 generates a low-level one-shot pulse synchronously with a rise edge of corresponding one of the clock signals CLK0 to CLK7. Output signals of the one-shot-pulse generation circuits OP0, OP2, OP4, and OP6 are supplied to an NAND gate circuit 131. An output signal of the NAND gate circuit 131 is supplied to a gate electrode of a P-channel MOS transistor 134 via an inverter circuit 132 and a timing adjustment circuit 133. A power supply potential VPERI is supplied to a source of the transistor 134 and accordingly the transistor 134 functions as a driver circuit that drives the internal clock signal ICLK1 to a high level. Similarly, output signals of the one-shot-pulse generation circuits OP1, OP3, OP5, and OP7 are supplied to a NAND gate circuit 135. An output signal of the NAND gate circuit 135 is supplied to a gate electrode of an N-channel MOS transistor 138 via inverter circuits 136 and 137. A ground potential VSS is supplied to a source of the transistor 138 and accordingly the transistor 138 functions as a driver circuit that drives the internal clock signal ICLK1 to a low level.

The timing adjustment circuit 133 includes transistors P1 and N1 having the same sizes as those of transistors P2 and N2, respectively, included in the inverter circuit 137. An output signal of the inverter circuit 132 is supplied to sources of the transistors P1 and N1. Because the ground potential VSS is supplied to a gate electrode of the transistor P1 and the power supply potential VPERI is supplied to a gate electrode of the transistor N1, the transistors P1 and N1 are always in an on-state. Therefore, when the output signal from the inverter circuit 132 has a high level, the output signal from the inverter circuit 132 is supplied to the gate electrode of the transistor 134 via the transistor P1. This flow of the output signal has the same condition as that of a signal flowing to the gate electrode of the transistor 138 via the transistor P2 when an output signal of the inverter circuit 136 changes to a low level. Similarly, when the output signal from the inverter circuit 132 has a low level, the output signal from the inverter circuit 132 is supplied to the gate electrode of the transistor 134 via the transistor N1. This flow of the output signal has the same condition as that of a signal flowing to the gate electrode of the transistor 138 via the transistor N2 when the output signal of the inverter circuit 136 changes to a high level. In this way, operation timings of the transistors 134 and 138 are matched with each other.

Figure 7:
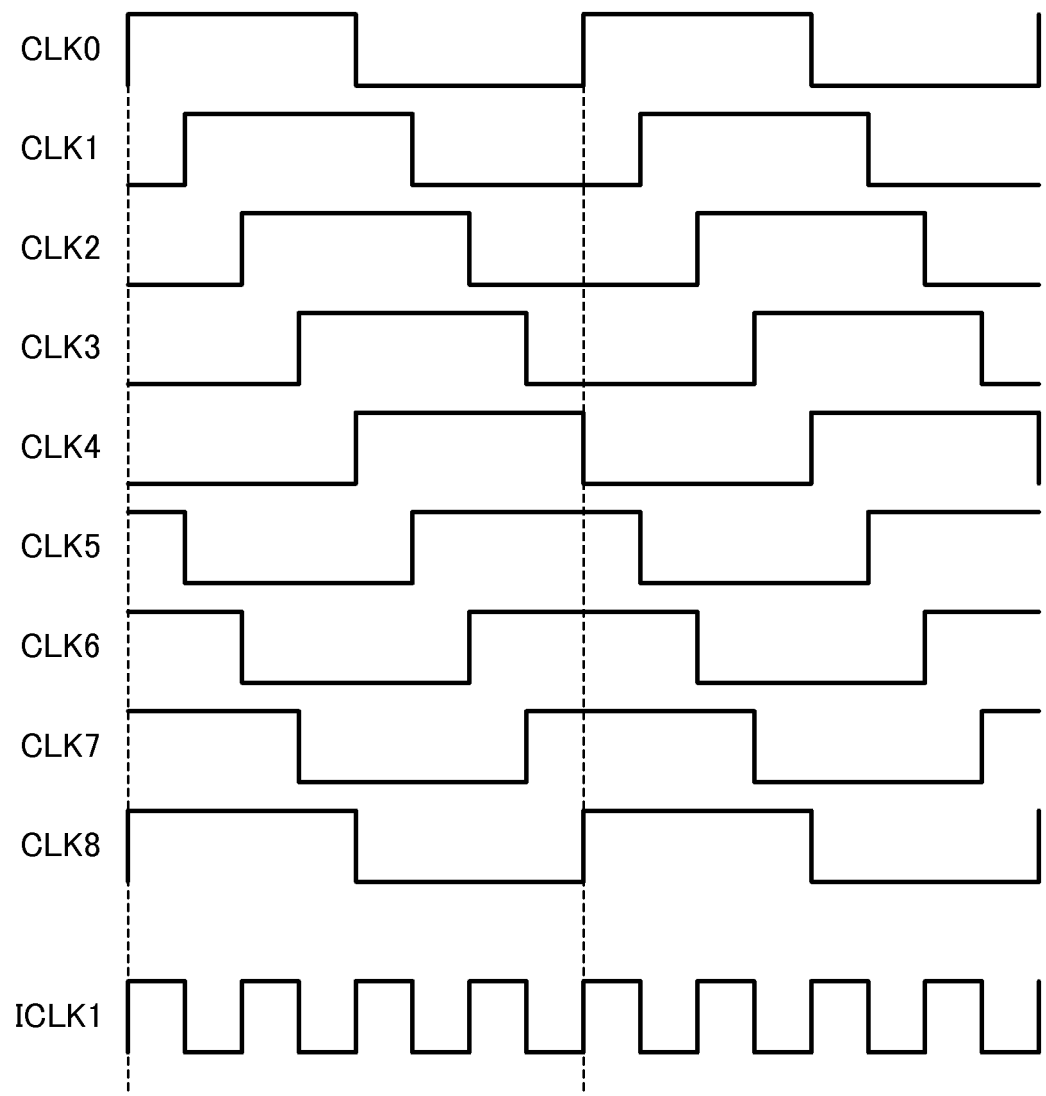
FIG. 7 is a waveform chart for explaining an operation of the waveform synthesis circuit.

In an example shown in FIG. 7, the clock signal CLK8 is delayed with respect to the clock signal CLK0 by one cycle.

That is, the delay amount obtained by the delay circuits 111 to 118 shown in FIG. 3 corresponds to one cycle of the clock signal CLK0. In this case, the phases of the clock signals CLK0 to CLK7 are shifted from one another by ⅛ clock cycle as shown in FIG. 7. This means that rise edges of the clock signals CLK0 to CLK7 appear every ⅛ clock cycle. As mentioned above, when the clock signals CLK0 to CLK7 rise, a one-shot pulse is generated by the corresponding one-shot-pulse generation circuits OP0 to OP7, respectively.

Specifically, when one of the clock signals CLK0, CLK2, CLK4, and CLK6 changes from a low level to a high level, a low-level one-shot pulse is output from corresponding one of the one-shot-pulse generation circuits OP0, OP2, OP4, and OP6 and thus the transistor 134 is turned on in response thereto. Accordingly, the internal clock signal ICLK1 rises to a high level. On the other hand, when one of the clock signals CLK1, CLK3, CLK5, and CLK7 changes from a low level to a high level, a low-level one-shot pulse is output from corresponding one of the one-shot-pulse generation circuits OP1, OP3, OP5, and OP7 and thus the transistor 138 is turned on in response thereto. Accordingly, the internal clock signal ICLK1 falls to a low level.

Therefore, when the clock signals CLK0 to CLK7 rise in this order as shown in FIG. 7, the logic level of the internal clock signal ICLK1 changes synchronously therewith. That is, the logic level of the internal clock signal ICLK1 changes every ⅛ clock cycle, so that the internal clock signal ICLK1 having four times faster than the clock signal CLK0 is generated.

If the clock cycle of the internal clock signal ICLK1 becomes slightly longer than the fourfold cycle of the clock signal CLK0, the phase of the clock signal CLK8 is delayed with respect to that of the clock signal CLK0 and accordingly the operating voltage Vdly is increased by the regulator circuit 120 shown in FIG. 2, which decreases the delay amount of one delay circuit. In this way, the clock cycle of the internal clock signal ICLK1 is controlled to be reduced. On the contrary, if the cycle of the internal clock signal CILK1 becomes slightly shorter than the fourfold cycle of the clock signal CLK0, the phase of the clock signal CLK8 is advanced with respect to that of the clock signal CLK0 and accordingly the operating voltage Vdly is decreased by the regulator circuit 120, which increases the delay amount of one delay circuit. In this way, the clock cycle of the internal clock signal ICLK1 is controlled to be increased. By repeating this operation, the cycle of the internal clock signal ICLK1 is correctly controlled to be four times faster than that of the clock signal CLK0 and the phase of the internal clock signal ICLK1 exactly matches with that of the clock signal CLK0.

Figure 8:
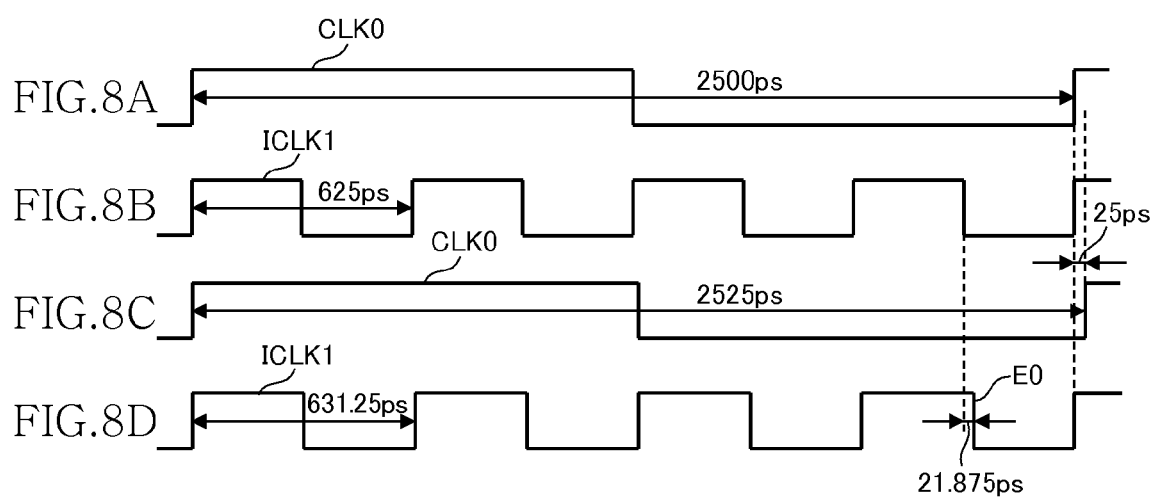
FIGS. 8A to 8D are waveform charts for explaining an influence in a case where the clock signal CLK0 and the clock signal CLK8 are out of phase.

Turning to FIGS. 8A to 8D, FIG. 8A shows a waveform of the clock signal CLK0 having a cycle of 2500 ps (picoseconds), for example. Ideally, in this case, the cycle of the internal clock signal ICLK1 is expected to be 625 ps as shown in FIG. 8B. However, if the delay amount obtained by the delay circuits 111 to 118 is slightly longer than one cycle of the clock signal CLK0 and 2525 ps, for example, as shown in FIG. 8C, the cycle of the internal clock signal ICLK1 actually obtained is 631.25 ps. In this case, a difference between an edge of the ideal internal clock signal ICLK1 and an edge of the internal clock signal ICLK1 actually obtained increases with passage of the time from appearance of a rise edge of the clock signal CLK0 and reaches 21.875 ps at the last edge E0 as shown in FIG. 8D. However, this phase difference is reset at the next rise edge of the clock signal CLK0. Therefore, a phenomenon in which a phase difference is accumulated little by little as in the PLL circuit using the ring oscillator does not occur.

While the case where the delay amount obtained by the delay circuits 111 to 118 is equal to one cycle of the clock signal CLK0 has been explained above, the variable delay circuit 110 shown in FIG. 3 locks the phases if the delay amount obtained by the delay circuits 111 to 118 is an integral multiple of the cycle of the clock signal CLK0. The lock means a state where a control is executed to keep a state where a rise edge of the clock signal CLK0 and a rise edge of the clock signal CLK8 match with each other.

Figure 9:
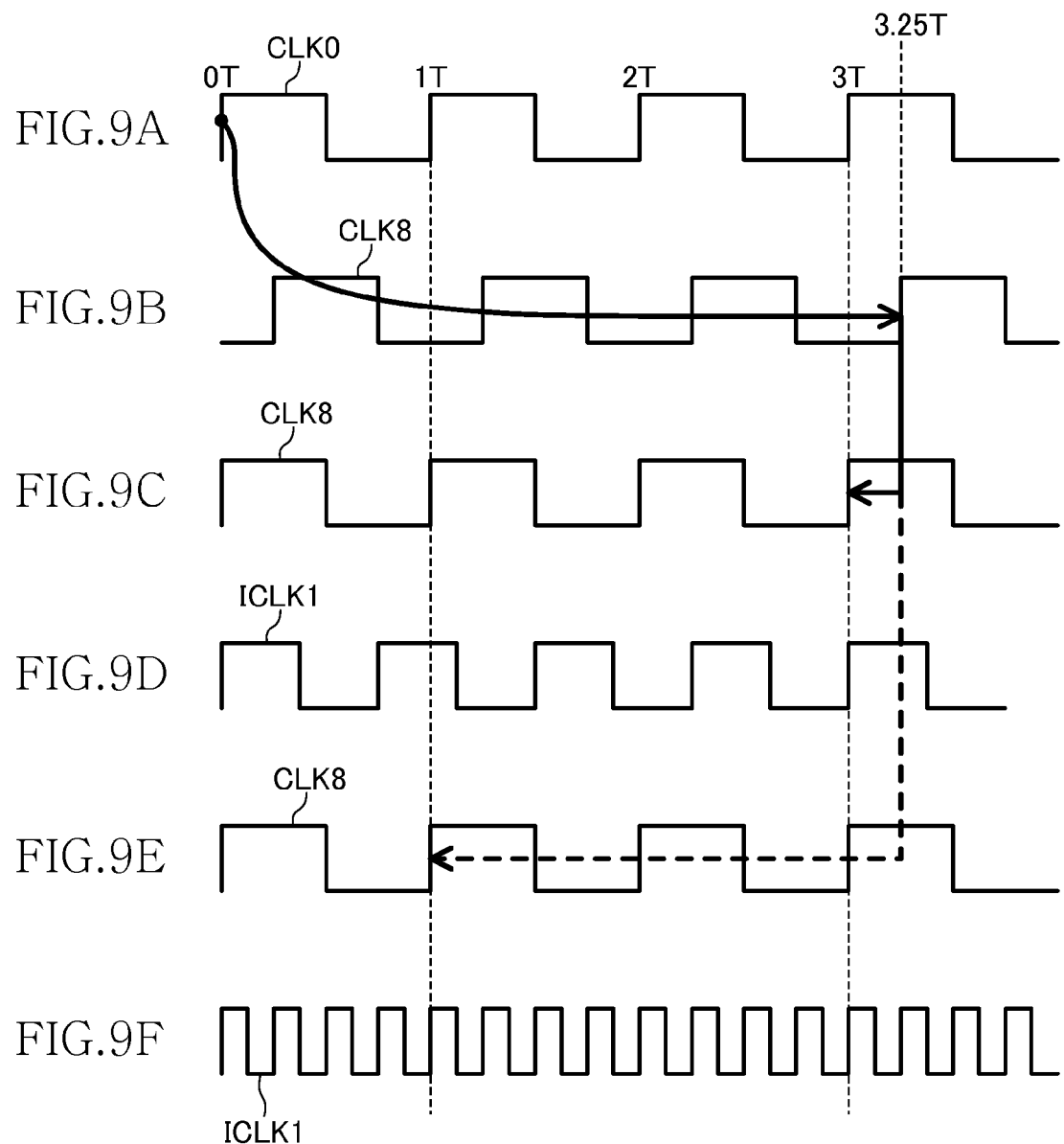
FIGS. 9A to 9F are a waveform charts for explaining a problem occurred in the case where the target edge is more than one clock cycle after source edge.

For example, when the delay amount obtained by the delay circuits 111 to 118 is 3.25 cycles of the clock signal CLK0 as shown in FIG. 9A, the variable delay circuit 110 adversely executes a control to match the delay amount obtained by the delay circuits 111 to 118 with three cycles (3T) of the clock signal CLK0. A waveform shown in FIG. 9A indicates the clock signal CLK0 and waveforms shown in FIGS. 9B and 9C indicate the clock signal CLK8 before and after the control, respectively. That is, FIG. 9C shows a state where the clock signal CLK8 is locked with the clock signal CLK0 shown in FIG. 9A in a delay of three cycles with respect thereto. In this case, the waveform of the obtained internal clock signal ICLK1 is as shown in FIG. 9D and is quite different from an intended frequency (four times that of the clock signal CLK0).

To obtain the intended frequency, the delay amount obtained by the delay circuits 111 to 118 needs to be controlled in such a manner that the clock signal CLK8 is delayed with respect to the clock signal CLK0 by one clock cycle (1T) as shown in FIG. 9E. FIG. 9F shows the internal clock signal ICLK1 locked at the intended frequency.

To avoid the problem explained with reference to FIGS. 9A to 9D, that is, the problem that the delay amount obtained by the delay circuits 111 to 118 is locked at n clock cycles (n is an integer equal to or larger than two) of the clock signal CLK0, the multiplier oscillator 100 according to the present embodiment includes a reference-edge detection circuit 140.

Figure 10:
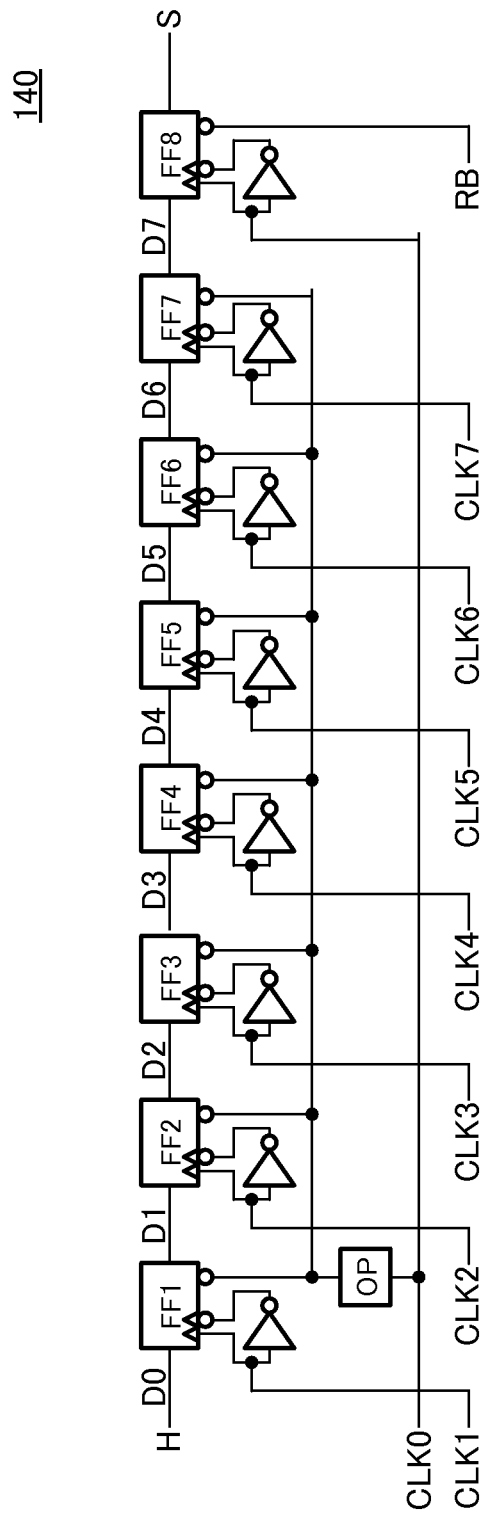
FIG. 10 is a circuit diagram of the reference-edge detection circuit shown in FIG. 2.

Turning to FIG. 10, the reference-edge detection circuit 140 includes eight latch circuits FF1 to FF8 that are cascade-connected. Among these circuits, each of the latch circuits FF1 to FF7 receives input data from a latch circuit at the previous stage synchronously with a rise edge of corresponding one of the clock signals CLK1 to CLK7. Input data D0 supplied to the latch circuit FF1 at the first stage is fixed to a high level. The latch circuit FF8 at the last stage receives input data D7 from the latch circuit FF7 at the previous stage synchronously with a rise edge of the clock signal CLK0. A determination signal S output from the latch circuit FF8 at the last stage is supplied to the regulator circuit 120 shown in FIG. 2.

Each of the latch circuits FF1 to FF8 has a reset node. When the reset node is activated, the latch data is reset to a low level. As shown in FIG. 10, the output signal of the one-shot-pulse generation circuit OP that generates a one-shot pulse synchronously with a rise edge of the clock signal CLK0 is supplied to the reset nodes of the latch circuits FF1 to FF7. Accordingly, the latch circuits FF1 to FF7 are reset each time the clock signal CLK0 changes to a high level. A reset signal RB activated at the time of an initialization operation is supplied to the reset node of the latch circuit FF8.

Figure 11:
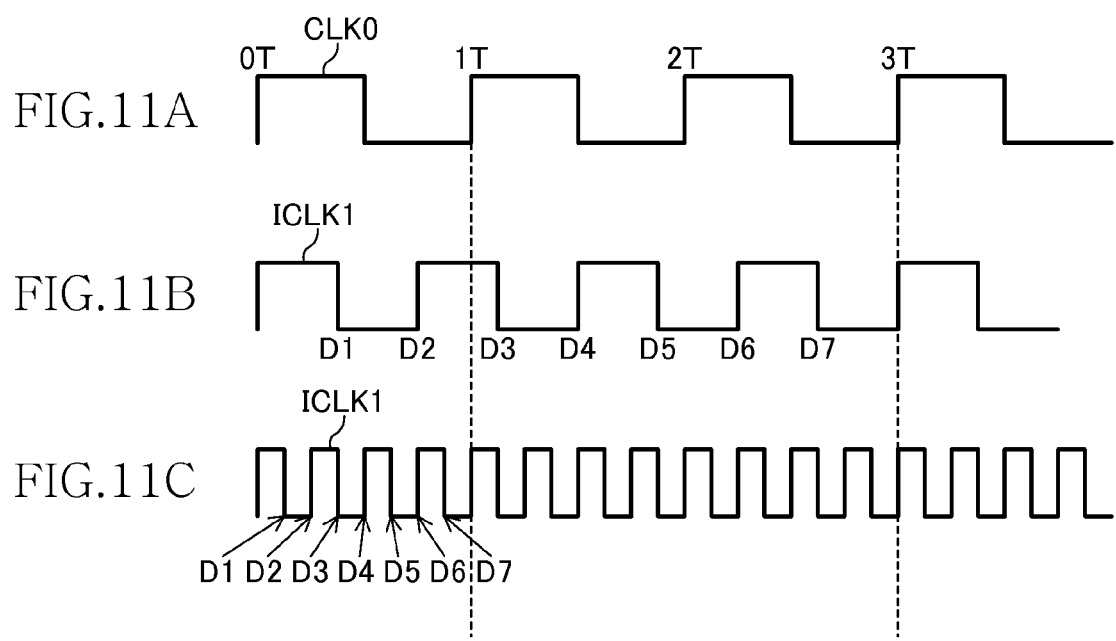
FIGS. 11A to 11C are waveform charts for explaining an operation of the reference-edge detection circuit.

FIG. 11A shows a waveform of the clock signal CLK0 and FIGS. 11B and 11C show waveforms of the internal clock signal ICLK1 generated in cases where the delay amount obtained by the delay circuits 111 to 118 is three clock cycles and one clock cycle of the clock signal CLK0, respectively.

First, in the case where the delay amount obtained by the delay circuits 111 to 118 is three clock cycles of the clock signal CLK0, output signals D1 to D7 of the latch circuits FF1 to FF7 are excepted to change to a high level at timings shown in FIG. 11B, respectively, assuming that the latch circuits FF1 to FF7 are not reset. However, all of the latch circuits FF1 to FF7 are actually reset each time the clock signal CLK0 rises and thus a high-level output signal D7 never reaches the latch circuit FF8 at the last stage. That is, after being reset at the initialization operation, the latch circuit FF8 at the last stage keeps the initial state and accordingly the determination signal S is kept at a low level.

When the determination signal S is kept at the low level, the regulator circuit 120 shown in FIG. 2 increases the operating voltage Vdly regardless of the phase determination signal PD. This is because the delay amount obtained by the delay circuits 111 to 118 is far beyond one clock cycle of the clock signal CLK0 and thus the delay amount needs to be forcibly reduced to prevent erroneous locking at n clock cycles (n is an integer equal to or larger than two) of the clock signal CLK0.

When the delay amount obtained by the delay circuits 111 to 118 is forcibly reduced in this way, the delay amount is shortened to near one clock cycle of the clock signal CLK0. In this case, before the latch circuits FF1 to FF7 are reset, the output signals D1 to D7 of the latch circuits FF1 to FF7 change to a high level at timings shown in FIG. 11C, respectively, and thus a high-level output signal D7 reaches the latch circuit FF8 at the last stage. As a result, the determination signal S changes to a high level. When the determination signal S changes to the high level, the regulator circuit 120 starts the operation based on the phase determination signal PD. The operation of the regulator circuit 120 based on the phase determination signal PD is as explained above and the operating voltage Vdly is controlled to match the delay amount obtained by the delay circuits 111 to 118 with one clock cycle of the clock signal CLK0.

With this operation, the multiplier oscillator 100 according to the present embodiment controls the delay amount obtained by the delay circuits 111 to 118 to delay the phase of the clock signal CLK8 with respect to that of the clock signal CLK0 exactly by one clock cycle, so that the phenomenon in which locking is performed at an unintended frequency can be prevented.

As described above, with the multiplier oscillator 100 according to the present embodiment, the internal clock signal ICLK1 being a signal obtained by correctly multiplying the input clock signal CLK0 can be generated. Furthermore, a correct internal clock signal can be generated with lower power consumption than in an oscillation circuit using a ring oscillator.

While the internal clock signal ICLK1 having a frequency four times higher than that of the clock signal CLK0 is generated using the eight delay circuits 111 to 118 in the present embodiment, the frequency of an internal clock signal to be generated can be arbitrarily set according to the number of delay circuits to be used. Specifically, when N delay circuits are used, an internal clock signal having N/2 times the frequency (2/N times the clock cycle) of the clock signal CLK0 can be generated.

The multiplier oscillator 100 according to the present embodiment can be applied also to a DLL (Delay-Locked Loop) circuit.

Figure 12:
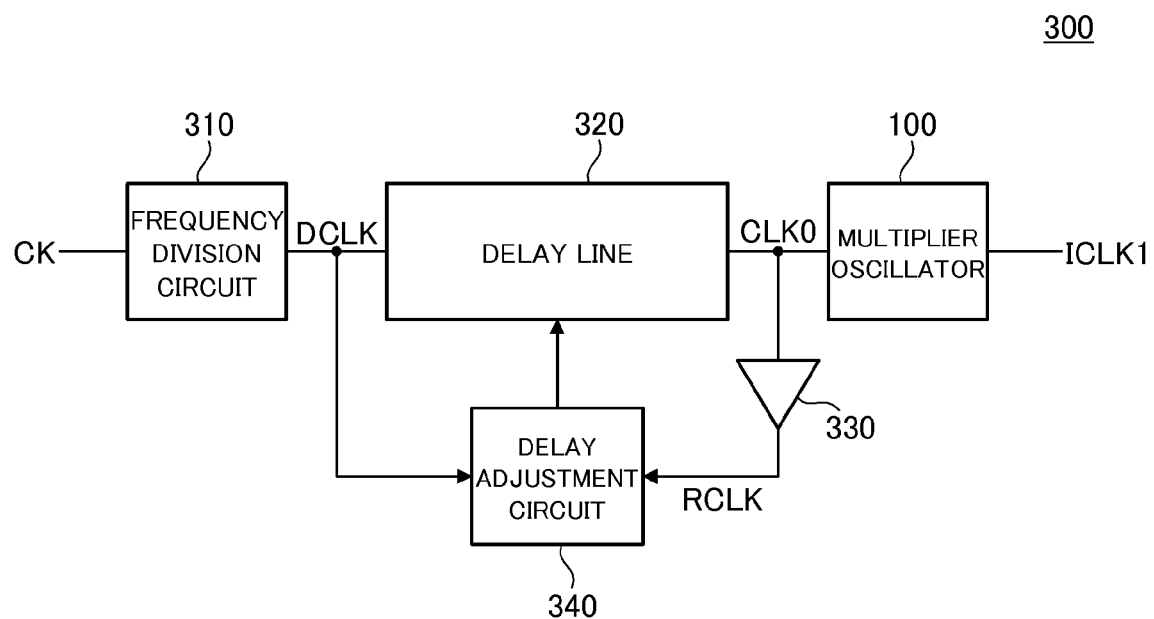
FIG. 12 is a block diagram showing a configuration of a DLL circuit using the multiplier oscillator.

Turning to FIG. 12, the DLL circuit 300 according to the first example includes a frequency division circuit 310 that generates a frequency-divided clock signal DCLK by frequency-dividing the external clock signal CK and a delay line 320 that delays the frequency-divided clock signal DCLK. The delay line 320 generates an input clock signal CLK0 that is phase-controlled. The input clock signal CLK0 is supplied to the multiplier oscillator 100.

The input clock signal CLK0 is supplied also to a replica buffer circuit 330. A replica clock signal RCLK, which is an output signal from the replica buffer circuit 330, is fed back to a delay adjustment circuit 340. The delay adjustment circuit 340 performs a phase comparison operation between the replica clock signal RCLK and the frequency-divided clock signal DCLK to control a delay amount of the delay line 320 based on the result of the phase comparison operation.

Figure 13:
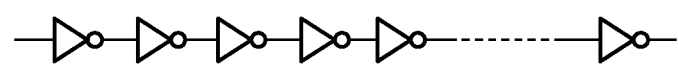
FIG. 13 is a circuit diagram of the delay line shown in FIG. 12.

The delay line 320 has a configuration including a plurality of inverter circuits that are cascade-connected as shown in FIG. 13 and the clock signal CLK0 is extracted from any one of the inverter circuits selected by the delay adjustment circuit 340. Specifically, when the phase of the replica clock signal RCLK is delayed with respect to that of the frequency-divided clock signal DCLK, the clock signal CLK0 is extracted from an inverter circuit at a more previous stage because the delay amount needs to be smaller. One the contrary, when the phase of the replica clock signal RCLK is advanced with respect to that of the frequency-divided clock signal DCLK, the clock signal CLK0 is extracted from an inverter circuit at a more subsequent stage because the delay amount needs to be larger. By repeating this operation, the phase of the replica clock signal RCLK is matched with that of the frequency-divided clock signal DCLK.

Figure 14A:
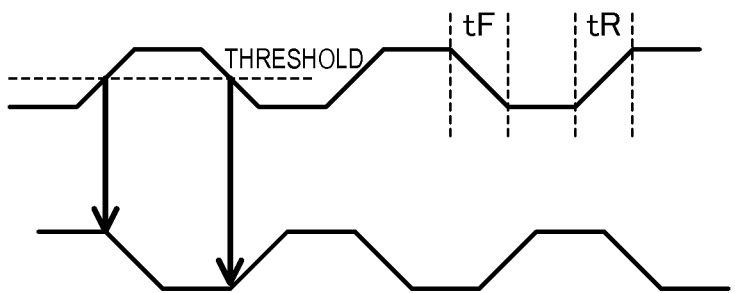
FIGS. 14A and 14B are waveform charts for explaining rise time and the fall time of the inverter circuit shown in FIG. 13.
Figure 14B:

In this case, a problem occurs that, when a clock signal to be supplied to the delay line 320 has a higher frequency, signal quality is greatly deteriorated if a delay amount of each stage of the inverter circuits included in the delay line 320 is not set smaller. That is, as shown in FIG. 14A, the inverter circuits have a threshold voltage and, each time the level of the input signal shown in FIG. 14A exceeds the threshold voltage, an output signal shown in FIG. 14B is inverted. However, a change in the input signal or the output signal requires a certain time. In the waveform shown in FIG. 14A, tR denotes a time required for arise of the input signal and tF denotes a time required for a fall of the input signal. If lengths of the rise time tR and the fall time tF are sufficiently shorter than the clock cycle of the clock signal passing through the delay line 320, no problem occurs.

Figure 15:
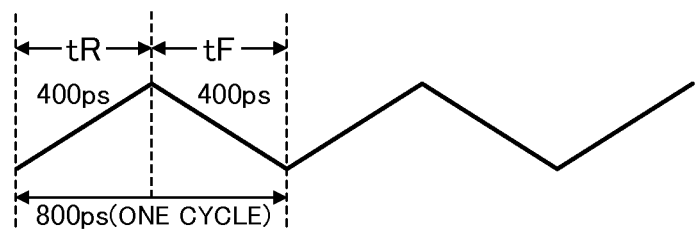
FIG. 15 is a waveform chart for explaining a problem in a case where a clock signal has high frequency.

However, when the clock signal passing through the delay line 320 is faster, the clock cycle thereof is shorter and thus influences of the rise time tR and the fall time tF become negligible. It is found that a clock signal having a cycle shorter than 800 ps cannot be correctly transmitted when the rise time tR and the fall time tF are both 400 ps, for example, as shown in FIG. 15.

This problem can be solve by arranging the frequency division circuit 310 at the previous stage of the delay line 320 as in the DLL circuit 300 shown in FIG. 12. That is, when the frequency division circuit 310 is arranged at the previous stage of the delay line 320, a clock signal passing through the delay line 320 has a frequency reduced to one-fourth or one-eighth, for example, and thus the problem mentioned above does not occur. The frequency reduced by the frequency division circuit 310 can be then regenerated by multiplying the clock signal CLK0 output from the delay line 320 with the multiplier oscillator 100.

When the multiplier oscillator 100 according to the present embodiment is applied to the DLL circuit in this way, the phase control can be correctly executed even when the external clock signal CK has a high frequency.

Figure 16:
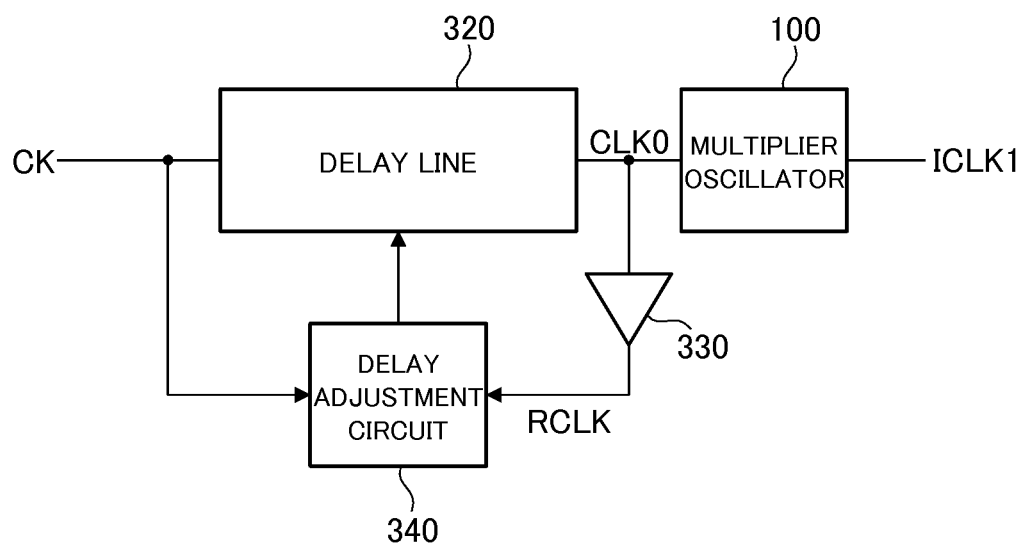
FIG. 16 is a block diagram showing a configuration of another DLL circuit using the multiplier oscillator.

Turning to FIG. 16, the DLL circuit 350 according to the second example is different from the DLL circuit 300 shown in FIG. 12 in that the frequency division circuit 310 is omitted. Because other elements are the same as those in the DLL circuit 300 shown in FIG. 12, like elements are denoted by like reference characters and redundant explanations will be omitted. According to the DLL circuit 350 shown in FIG. 16, the internal clock signal ICLK1 having a higher frequency than that of the external clock signal CK can be correctly phase-controlled. Furthermore, because the multiplier oscillator 100 is arranged at the subsequent stage of the delay line 320, not at the previous stage thereof, the frequency of a clock signal passing through the delay line 320 never become higher than that of the external clock signal CK.

It is apparent that the present invention is not limited to the above embodiments, but may be modified and changed without departing from the scope and spirit of the invention.

What is claimed is:

1. A device comprising:
   a plurality of delay circuits connected in series, the delay circuits including an input-stage delay circuit receiving an input clock signal and an output-stage delay circuit outputting an output clock signal, each of the delay circuits representing a delay amount responsive to an operating voltage supplied thereto;
   a regulator circuit controlling the operating voltage to be supplied to each of the delay circuits in response to a phase relationship between the input clock signal and the output clock signal; and
   a synthesizing circuit configured to synthesize an internal clock signal based on clock signals supplied to selected ones of the delay circuits.

2. The device as claimed in claim 1, wherein the delay circuits have the same circuit configuration as one another.

3. The device as claimed in claim 2, wherein each of the delay circuits includes even stages of inverter circuits connected in series.

4. The device as claimed in claim 1, wherein the regulator circuit increases the operating voltage when the output clock signal has a first logic level at a timing when the input clock signal changes from the first logic level to a second logic level, and decreases the operating voltage when the output clock signal has the second logic level at a timing when the input clock signal changes from the first logic level to the second logic level.

5. The device as claimed in claim 4, further comprising a reference-edge detection circuit that decreases the operating voltage when a delay amount of the delay circuits exceeds a predetermined cycle that is longer than one cycle of the input clock signal.

6. The device as claimed in claim 1, wherein the synthesis circuit inverts a logic level of the internal clock signal each time logic levels of the clock signals supplied to the selected ones of the delay circuits change.

7. The device as claimed in claim 6, wherein the synthesis circuit changes the internal clock signal from a third logic level to a fourth logic level when clock signals supplied to even-numbered ones of the selected ones of the delay circuits change from a first logic level to a second logic level, and changes the internal clock signal from the fourth logic level to the third logic level when clock signals supplied to odd-numbered ones of the selected ones of the delay circuits change from the first logic level to the second logic level.

8. The device as claimed in claim 1, further comprising:
   a memory cell array including a plurality of memory cells; and
   a peripheral circuit unit controlling an operation of the memory cell array,
   wherein the memory cell array operates synchronously with the input clock signal and the peripheral circuit unit operates synchronously with the internal clock signal in a predetermined test mode.

9. The device as claimed in claim 1, further comprising a DLL circuit that controls a phase of the input clock signal.

10. The device as claimed in claim 9, further comprising a frequency division circuit that generates a frequency-divided clock signal by frequency-dividing an external clock signal supplied from outside the device,
    wherein the DLL circuit generates the input clock signal by delaying the frequency-divided clock signal.

11. A method comprising:
    electrically connecting N delay circuits in series, N being two or more integers;
    controlling a level of an operating voltage to be supplied to each of the delay circuits so that a delay amount of each of the delay circuits becomes 1/N of a cycle of an input clock signal supplied to a leading one of the delay circuits; and
    responding to signals to be respectively delayed by the delay circuits to generate an internal clock signal having a frequency that is N/2 times as large as the input clock signal.

12. The method as claimed in claim 11, wherein the electrically connecting comprises connecting even numbers of inverter circuits in series to provide each of the delay circuits.

13. A device comprising:
    a plurality of delay circuits each including an input node, an output node, a first power node and a second power node, the delay circuits being coupled in series such that the output node of a preceding one of the delay circuits is coupled to the input node of the succeeding one of the delay circuits, the input node of a leading one of the delay circuits receiving a first clock signal, the output node of a last one of the delay circuits producing a second clock signal, the first power node of each of the delay circuits being connected to a first power line, and the second power node of each of the delay circuits being connected to a second power line; and
    a control circuit coupled to receive the first and second clock signals to control an operating voltage supplied between the first and second power lines.

14. The device as claimed in claim 13, wherein the control circuit comprises a phase discrimination circuit that discriminates a phase difference between the first and second clock signal and a voltage circuit that responds an output signal of the phase discrimination circuit to vary the operating voltage.

15. The device as claimed in claim 13, further comprising a synthesizing circuit coupled to the input node of each of the delay circuits to produce at an output terminal thereof a third clock signal that is greater in frequency than each of the first and second clock signals.

16. The device as claimed in claim 13, wherein each of the delay circuit comprises N pieces of inverters, N being an even number.

17. The device as claimed in claim 16, wherein each of the inverters comprising a first transistor of a first channel type and a second transistor of a second channel type that are connected in series between the first and second power nodes.

18. The device as claimed in claim 15, wherein the synthesizing circuit comprises a first transistor connected between a first potential line and the output terminal, a second transistor connected between a second potential line and the output terminal, a first driver coupled to the input node of each of odd-numbered ones of the delay circuits to drive the first transistor, and a second driver coupled to the input node of each of even-numbered ones of the delay circuits to drive the second transistor.

19. The device as claimed in claim 13, wherein a number of the delay circuits is even.

20. The device as claimed in claim 19, wherein the number of delay circuits is even and is four or more.

\* \* \* \* \*